(12) United States Patent  
Jalla

(10) Patent No.: US 10,824,992 B1  
(45) Date of Patent: Nov. 3, 2020

(54) METHOD AND SYSTEM FOR ANALYZING AND OPTIMIZING SHIPPING OF SHEATHING MATERIALS FOR FLOORS

(71) Applicant: Consulting Engineers, Corp., Reston, VA (US)

(72) Inventor: Maharaj Jalla, Great Falls, VA (US)

( * ) Notice: Subject to any disclaimer, the term of this patent is extended or adjusted under 35 U.S.C. 154(b) by 0 days.

(21) Appl. No.: 16/824,697

(22) Filed: Mar. 20, 2020

Related U.S. Application Data

(63) Continuation of application No. 16/742,962, filed on Jan. 15, 2020, now Pat. No. 10,740,721.

(51) Int. Cl.
*G06Q 10/08* (2012.01)
*G06F 30/10* (2020.01)

(52) U.S. Cl.
CPC .......... *G06Q 10/087* (2013.01); *G06F 30/10* (2020.01); *G06Q 10/083* (2013.01)

(58) Field of Classification Search
CPC ....... G06F 30/13; G06T 17/05; G06Q 10/087; G06Q 10/0832
See application file for complete search history.

(56) References Cited

U.S. PATENT DOCUMENTS

2019/0156570 A1* 5/2019 Sanjurjo ............ G06K 9/00637

\* cited by examiner

*Primary Examiner* — A. Hunter Wilder
(74) *Attorney, Agent, or Firm* — Andrew Morabito

(57) ABSTRACT

The present invention is a computer method a computer method for calculating and arranging sheathing material for a floor space of a building, comprising: analyzing a building model, wherein floor frame members are identified and isolated; processing a surface of the floor frame members; calculating an area of the surface; selectin, a sheathing material for the surface, wherein the sheathing material has a predetermined panel size; generating a graphical illustration on the model of the sheathing material panel layout; manipulating the sheathing material panels to substantially cover the area of the surface, wherein excess sheathing material panels are removed from the model; arranging the sheathing material based on an analyzed installation process; and formulating a bundle, wherein the bundle is comprised of the pieces of the sheathing material required to substantially cover the area of the surface of the floor.

9 Claims, 9 Drawing Sheets

METHOD AND SYSTEM FOR ANALYZING AND OPTIMIZING SHIPPING OF SHEATHING MATERIALS FOR FLOORS

CROSS-REFERENCE TO RELATED APPLICATIONS

This application is a continuation-in-part (and claims the benefit of priority under 35 USC 120) of U.S. application Ser. No. 16/742,962 filed Feb. 27, 2020. The disclosure of the prior applications is considered part of (and is incorporated by reference in) the disclosure of this application.

BACKGROUND

This disclosure relates to building construction and in particular, to a method, a computer program, or a computer system for optimization of the shipping methodology of sheathing material for floors.

Sheathing materials which are used to cover the frame of a building are manufactured in a factory or precut from the standard sizes as per the required size to cover the frame. The sheathing materials can be shaped shipped directly to the construction site for ease of installation. Presently, most construction sites receive the sheathing materials and they are cut by the workers to size. The workers also receive the shipment and are unaware how many panels are needed for each floor, room, roof, floor, etc. This need to calculate the amount of sheathing material results in downtime, wasted materials, and increase expenses for the client.

For example, a standard piece of gypsum board is 4 ft×8 ft. In some instances, the manufacturing is able to produce gypsum board panels of custom sizes or a worker is required to cut the standard piece to fit on the work site. Typically, the sheathing material are purchased in standard sizes and cut on-site by the workers as the cost and time for the manufacturing of custom size panels is not cost effective.

In current industry practice, the bundling of the sheathing materials together for shipping is not done in organized way. Each bundle occupies large volume and when the material is ship to the site, due to the large volume of each bundle the space inside the shipping container is not utilized in most optimized way. Hence it may become uneconomical.

In the current invention, the method of packaging of sheathing materials for the floors are packaged into a plurality of the bundles to the site are optimized in such way that it will occupy the least amount of space, improve the ease in identifying the location or position and shipping or transportation cost and the overall construction time is likely to be reduced. It is desired for the program or system to be able to analyze the building, determining the sheathing material and quantity and provide the most economical and cost-effective shipping method.

SUMMARY

In a first embodiment, the present invention is a computer method for calculating and arranging sheathing material for a floor space of a building, comprising: analyzing, by at least one processor, a building model, wherein floor frame members are identified and isolated; processing, by at least one processor, a surface of the floor frame members; calculating, by at least one processor, an area of the surface; selecting, by at least one processor, a sheathing material for the surface, wherein the sheathing material has a predetermined panel size; generating, by at least one processors, a graphical illustration on the model of the sheathing material panel layout; manipulating, by at least one processor, the sheathing material panels to substantially cover the area of the surface, wherein excess sheathing material panels are removed from the model; arranging, by at least one processor, the sheathing material based on an analyzed installation process; and formulating, by at least one processor, a bundle, wherein the bundle is comprised of the pieces of the sheathing material required to substantially cover the area of the surface of the floor.

In a second embodiment, the present invention is a computer program product for calculating and arranging sheathing material for a floor space of a building, comprising: one or more computer non-transitory readable storage media and program instructions stored on the one or more computer non-transitory readable storage media, the program instructions comprising: program instructions to analyze a building model, wherein floor frame members are identified and isolated; program instructions to process a surface of the floor frame members; program instructions to calculate an area of the surface; program instructions to select a sheathing material for the surface, wherein the sheathing material has a predetermined panel size; program instructions to generating, by at least one processors, a graphical illustration on the model of the sheathing material panel layout; program instructions to manipulate the sheathing material panels to substantially cover the area of the surface, wherein excess sheathing material panels are removed from the model; program instructions to arrange the sheathing material based on an analyzed installation process; and program instructions to formulate a bundle, wherein the bundle is comprised of the pieces of the sheathing material required to substantially cover the area of the surface of the floor.

In a third embodiment, the present invention is a system for calculating and arranging sheathing material for a floor space of a building, comprising: one or more computer processors, one or more computer non-transitory readable storage media, and program instructions stored on the one or more computer non-transitory readable storage media for execution by, at least one of the one or more processors, the program instructions comprising: program instructions to analyze a building model, wherein floor frame members are identified and isolated; program instructions to process a surface of the floor frame members; program instructions to calculate an area of the surface; program instructions to select a sheathing material for the surface, wherein the sheathing material has a predetermined panel size; program instructions to generating, by at least one processors, a graphical illustration on the model of the sheathing material panel layout; program instructions to manipulate the sheathing material panels to substantially cover the area of the surface, wherein excess sheathing material panels are removed from the model; program instructions to arrange the sheathing material based on an analyzed installation process; and program instructions to formulate a bundle, wherein the bundle is comprised of the pieces of the sheathing material required to substantially cover the area of the surface of the floor.

BRIEF DESCRIPTION OF THE DRAWINGS

Referring now to the drawings in which like reference numbers represent corresponding parts throughout.

DETAILED DESCRIPTION

Figure 1:
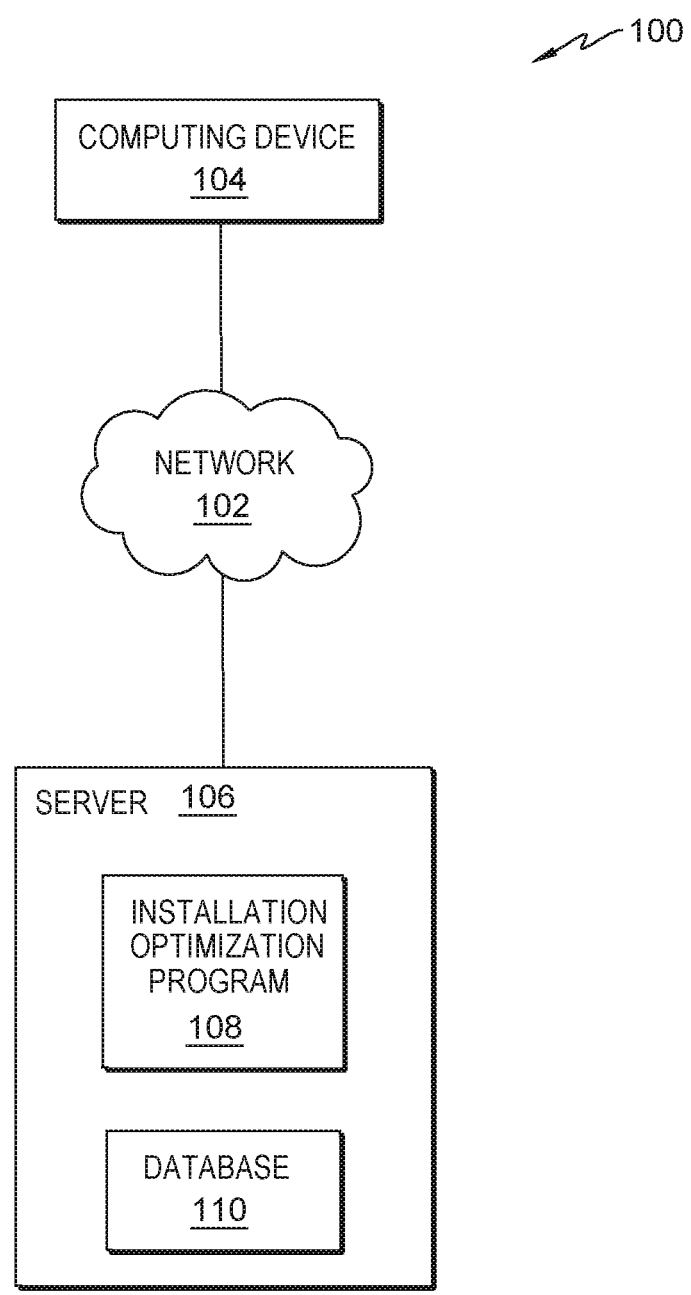
FIG. 1 depicts a block diagram depicting a computing environment, in accordance with one embodiment of the present invention.

This disclosure relates to building construction and in particular, to a method, a computer program, or a computer system for optimization of the packaging methodology of sheathing materials. Sheathing material may include plywood, oriented strand board, gypsum board, plaster, waferboard, glass, cement board, thermo-brace, and the like which is used in construction for exterior and interior floors. Sheathing materials are shipped to site in containers and the space inside the container has to be utilized in the most optimized way to reduce the wastage of the space and maximum material to be shipped on site in one trip of the shipping container. Additionally, the sheathing material needs to be packaged and stored in a way to reduce damage to the various panels. Panels is used to describe the various types of sheathing material which could be applied to a frame of a building. This may include, panels, pieces, or material that is applied (e.g. stucco, concrete, insulation, foam, or the like) to the frame to insulate, protect, or is used as a finishing product in the building process.

The present invention provides an advantage so that the sheathing materials are pre-engineered and pre-packaged to maximize the space filled and the volume of the shipping material is reduced and the materials are manufactured to size to preciously fit the floor where they are intended to be installed. In determining the ideal fitment of the materials, artificial intelligence is applied such that the overall volume of each bundle consumes the lease amount of volume of space and is packaged in a way to reduce the opportunity for the materials to be damaged. Additionally, the invention is able to take into account the overall container size, and the other bundles of materials to further adjust the bundle formations.

For each floor surface (formed from floor joists) the sheathing material panels are manufactured from the machine or will be cut in factory as per the given drawings in sequence, based on the artificial intelligence criteria, the members are fit inside each other and then the fitted double members are stacked on each other such way that the dimension of the bundle is within the maximum limits. This manufacturing or cutting also takes into account the type of sheathing material, the standard template sizes, and the like to further reduce waste and excess materials needed.

Based on the dimensions of the shipping container, the maximum limit of each bundle is determined. The length of the bundle cannot be longer than the maximum shipping container length. Similarly, when the bundles in the shipping container, the maximum number of bundles to be fit inside each container is within the shipping container width and depth.

The present invention uses a unique optimization feature where the plurality of the sheathing for each floor surface are analyzed by the program. Maximum dimensions of the shipping container are considered as the maximum limit of each bundle and maximum number of bundles inside each container are govern by container width and depth.

The present invention can reduce the no of shipping containers required to ship the material of the project construction from factory to site and reduce the cost of transportation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firefloors, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firefloors).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

FIG. 1 depicts a block diagram of a computing environment 100 in accordance with one embodiment of the present invention. FIG. 1 provides an illustration of one embodiment and does not imply any limitations regarding the environment in which different embodiments maybe implemented.

In the depicted embodiment, computing environment 100 includes network 102, computing device 104, and server 106. Computing environment 100 may include additional servers, computers, or other devices not shown.

Network 102 may be a local area network (LAN), a wide area network (WAN) such as the Internet, any combination thereof, or any combination of connections and protocols that can support communications between computing device 104 and server 106in accordance with embodiments of the invention. Network 102 may include wired, wireless, or fiber optic connections.

Computing device 104 may be a management server, a web server, or any other electronic device or computing system capable of processing program instructions and receiving and sending data. In other embodiments, computing device 104 may be a laptop computer, tablet computer, netbook computer, personal computer (PC), a desktop computer, or any programmable electronic device capable of communicating with patient computing device 104 via network 102. In other embodiments, computing device 104 may be a server computing system utilizing multiple computers as a server system, such as in a cloud computing environment. In one embodiment, computing device 104 represents a computing system utilizing clustered computers and components to act as a single pool of seamless resources. Computing device 104 may include components, as depicted and described in further detail with respect to FIG. 1.

Server 106 may be a management server, a web server, or any other electronic device or computing system capable of processing program instructions and receiving and sending data. In other embodiments server 106 may be a laptop computer, tablet computer, netbook computer, personal computer (PC), a desktop computer, or any programmable electronic device capable of communicating via network 102. In one embodiment, server 106 may be a server computing system utilizing multiple computers as a server system, such as in a cloud computing environment. In one embodiment, server 106 represents a computing system utilizing clustered computers and components to act as a single pool of seamless resources. In the depicted embodiment the installation optimization program 108 and database 110 are located on server 106. Server 106 may include components, as depicted and described in further detail with respect to FIG. 1.

The shipping optimization program 108 has the unique features of taking a constructed 3-Dimensional frame of a building, and through calculations and determinations, can compute a complete interior and/or exterior sheathing material requirements for the building to meet specific requirements of the project. The Installation optimization program 108 is able to receive building models or drawings and create the interior and/or exterior sheathing design, drawings, and features for the project and also optimize the quantity needed for the project.

Additionally, the installation optimization program 108 is able to provide the arrangement of the sheathing material for each floor surface to provide optimized installation as well. installation optimization program 108 determines the optimized and pre-cut size for each sheathing piece, thereby reducing the time required on the site for cutting of the sheathing material. By generating a 3D model of each piece of sheathing material and a drawing of each piece of sheathing material. A manufacturing facility can produce each piece exactly as required by the design. This is advantageous because the installation optimization program 108 generates a building list, reduces the chances of the unnecessary extra material on site. The installation optimization program 108 is able to further identify the number and type of parts or material needed to secure the sheathing material to the frame. This feature avoids the overestimation of fasteners or securing means and provides the optimum quantity to order on site.

Additionally, the installation optimization program 108 assists in determining the ideal methodology to bundle the sheathing materials for each floor surface for shipping. The installation optimization program 108 also is able to base the ideal bundling of the sheathing materials based on the container size, volume, and other bundle or items which will be in the container to reduce wasted space within the container, and provide a bundle design that fits with the other bundles or items in the container.

In the depicted embodiment, installation optimization program 108 utilizes network 102 to access the computing device 104 and to communicate with database 110. In one embodiment, installation optimization program 108 resides on computing device 104. In other embodiments, installation optimization program 108 may be located on another server or computing device, provided installation optimization program 108 has access to database 110.

Database 110 may be a repository that may be written to and/or read by installation optimization program 108. Information gathered from computing device 104 and the 1-dimensional, 2-dimensional, and 3-dimensional drawings and models as well as the requirements so that the materials and floor members are identified as conflicting or non-conflicting. In one embodiment, database 110 is a database management system (DBMS) used to allow the definition, creation, querying, update, and administration of a database(s). In the depicted embodiment, database 110 resides on computing device 104. In other embodiments, database 110 resides on another server, or another computing device, provided that database 110 is accessible to Sheathing installation optimization program 108.

Figure 2:
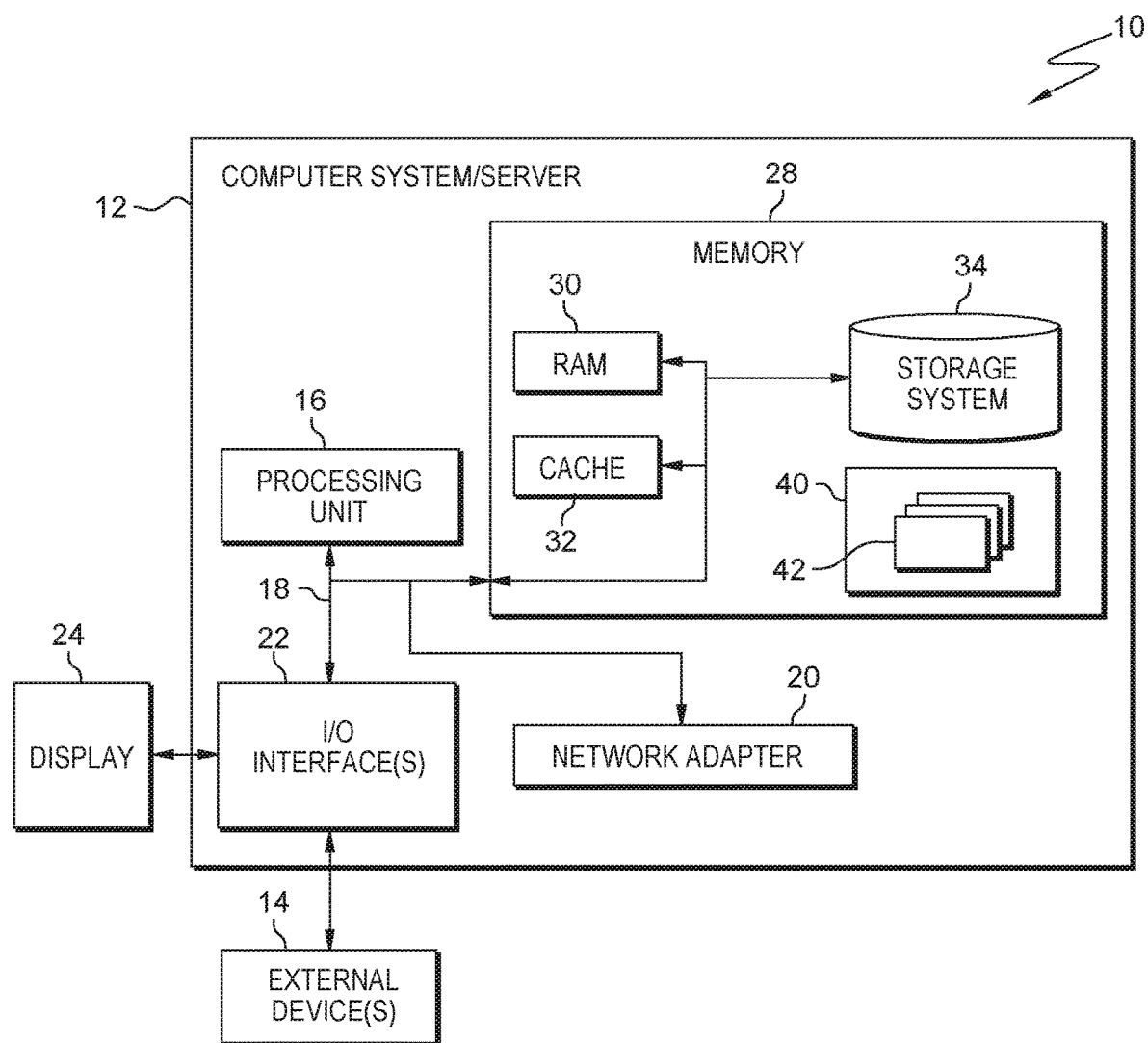
FIG. 2 depicts a block diagram depicting the internal and external components of the server and computing device of FIG. 1, in accordance with one embodiment of the present.

FIG. 2, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purposes or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

FIG. 2, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to microcode, device drivers, redundant processing units, external disk drive arrays, RAID systems, tape drives, and data archival storage systems, etc.

Figure 3:
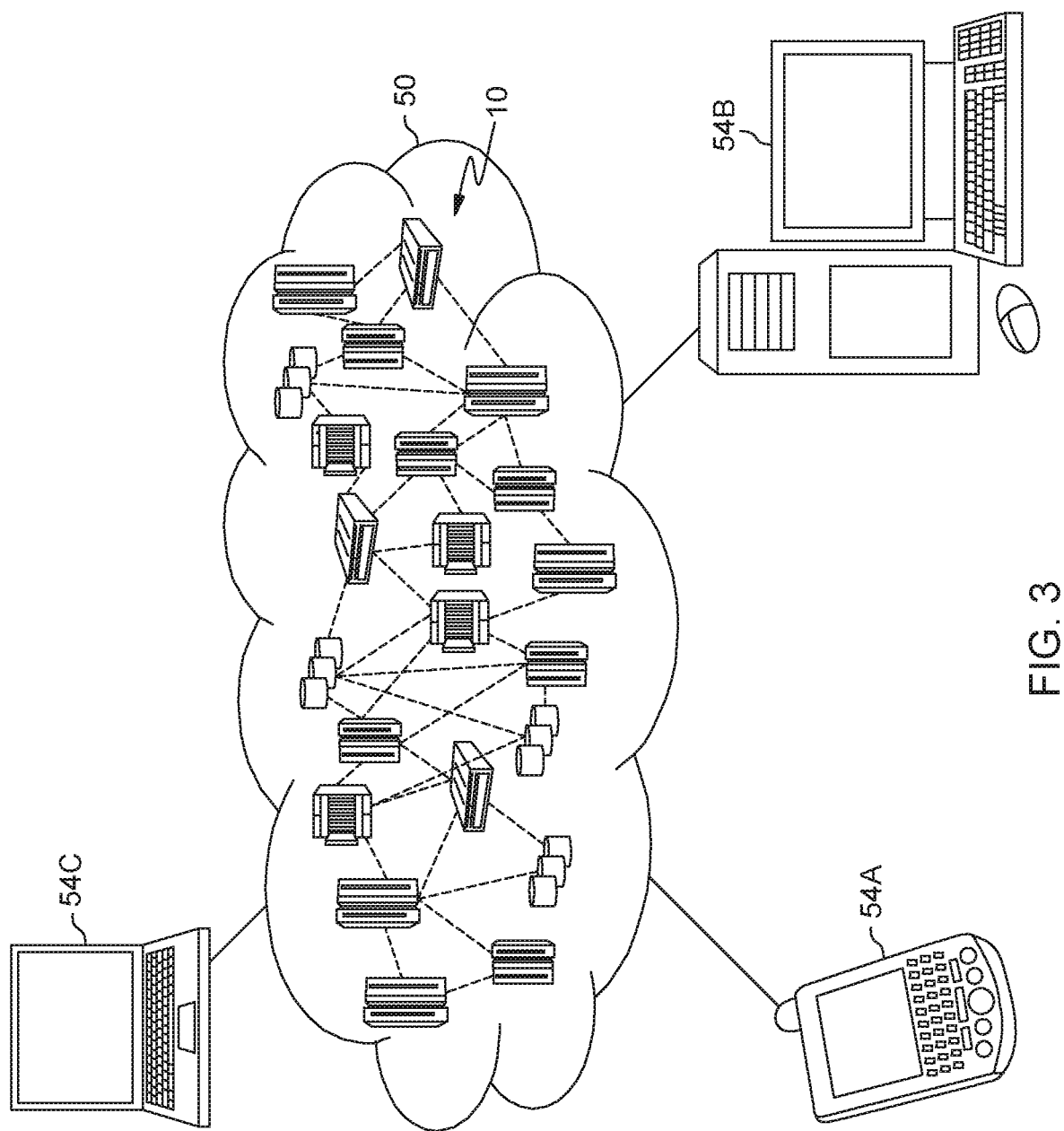
FIG. 3 depicts a cloud computing environment, in accordance with one embodiment of the present invention.

FIG. 3, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or additional computer systems may communicate.

Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-C shown in FIG. 2 are intended to be illustrative only and that computing nodes 10 and cloud computing environment 50 can communicate with any type of computerized device over any type of network and/or network addressable connection (e.g., using a web browser).

Referring back to FIG. 2, the Program/utility 40 may include one or more program modules 42 that generally carry out the functions and/or methodologies of embodiments of the invention as described herein. Specifically, the program modules 42 may monitor building construction sheathing material requirements. Determine the size and shape of each piece of sheathing material to reduce excess material that would be wasted. Then determine the most efficient bundling and shipping packaging methods to maximize the amount of materials within the container. Other functionalities of the program modules 42 are described further herein such that the program modules 42 are not limited to the functions described above. Moreover, it is noted that some of the modules 42 can be implemented within the infrastructure shown in FIGS. 1-3.

Figure 4:
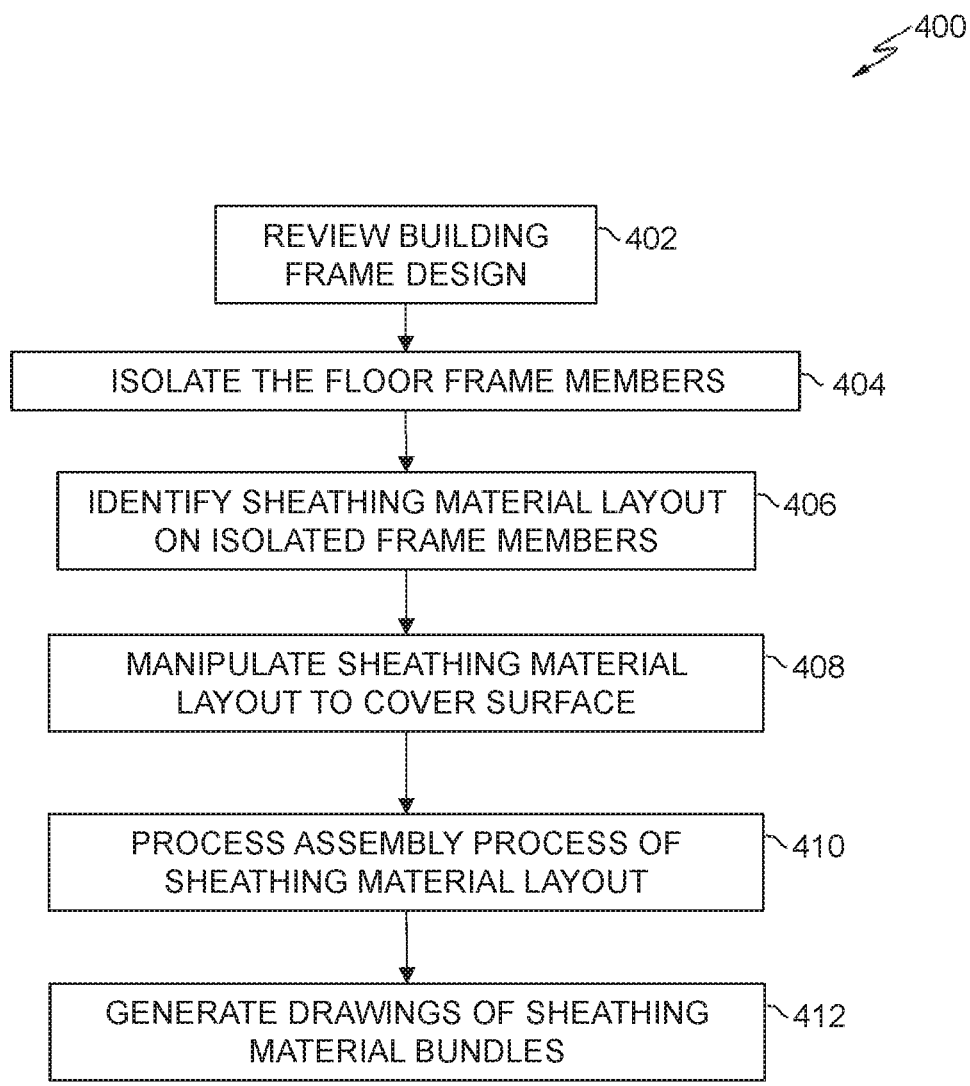
FIG. 4 depicts a flowchart of the operational steps of a method performed by a program within the computing environment of FIG. 1, in accordance with one embodiment of the present invention.

FIG. 4 depicts flowchart 400 depicting a method according to the present invention. The method(s) and associated process(es) are now discussed, over the course of the following paragraphs, in accordance with one embodiment of the present invention. The program(s) described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

In step 402, the installation optimization program 108 reviews the building frame design. The installation optimization program 108 receives or access the model or drawings related to the building. This may be a complete model or drawings of the building, or it may include only the floor frame members of the building. The installation optimization program 108 reviews these files or drawings to determine the floor surface areas of the building which are to be covered by the different types of sheathing materials. In some embodiments, where sheathing material is present in the building design, the installation optimization program 108 is able to identify the sheathing material layers, thickness, standard sheet size, and the like about the sheathing material.

In some embodiments, drawings of the building are created include 3D or 2D models of the building with the sheathing material installed. External views of the building are created from all floor surfaces such that all building surfaces are studied. Each layer is identified where multiple sheathing layers are applied. The layers of the floors can be in plurality of layers or single layers on external and internal side of the floor frame. Based on the desired insulation, sound proofing, or requirements, the number of sheathing layers may be increased. Drawings for each sheathing piece is created showing the specific location, the piece number, cutting dimension, and the like. Similarly, interior views of the building are created from all rooms or surfaces such that all building surfaces are studied. Each layer is identified where multiple sheathing layers are applied. Drawings for each sheathing piece is created showing the specific location, the piece number, cutting dimension, and the like In step 404, the installation optimization program 108 isolates the floor frame members. These specific frame members are analyzed individually and isolated from the other frame members to confirm a proper placement of the sheathing materials as the floor, floors, and roof are all analyzed independent of one another In step 406, the installation optimization program 108 identify the sheathing material layout to cover the floor surface. The installation optimization program 108 analyzes the floor surface to identify and determine which type of sheathing material is to be applied. Based on the selected sheathing material, the installation optimization program 108 analyzes the sheathing material properties and the required fastening means, standard section size, and the like. For example, an interior floor may require plywood. The installation optimization program 108 is able to determine the interior or exterior floor and identify the sheathing material to be applied. The selection may be performed by installation optimization program 108 based on computer learning or previous projects, geographic locations, or limitations of the frame or sheathing material.

Figure 5:
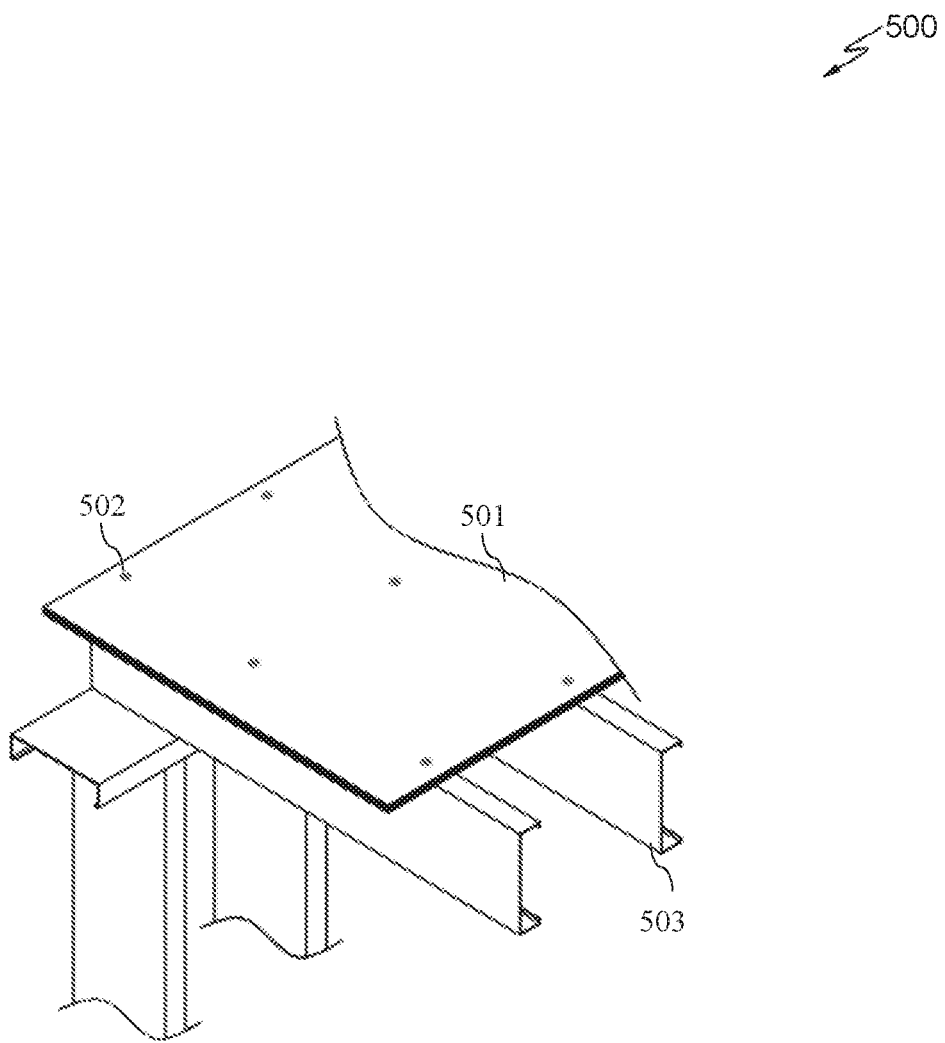
FIG. 5 depicts a section view of a floor with multiple layers of sheathing materials applied, in accordance with one embodiment of the present invention.

As depicted in FIG. 5, an illustration 500 of a section of floor is shown with three layers 501, 502, and 503 of sheathing material are applied to frame 504. Two top surfaces and one lower surface. These surfaces may include the floor of a room and the ceiling of a room below.

In step 408, installation optimization program 108 manipulates the sheathing material layout to cover the floor surface. The sheathing material layout is based on the type of sheathing material and the fastening means for the sheathing material. Based on the selected sheathing material type, the installation optimization program 108 is able to apply sections of the sheathing material to the frame and manipulate the sheathing material sections to cover the frame. In some embodiments, gaps may be left for areas with apertures (e.g. windows and doors), or between the sections to provide for finishing materials to be applied.

Figure 6:
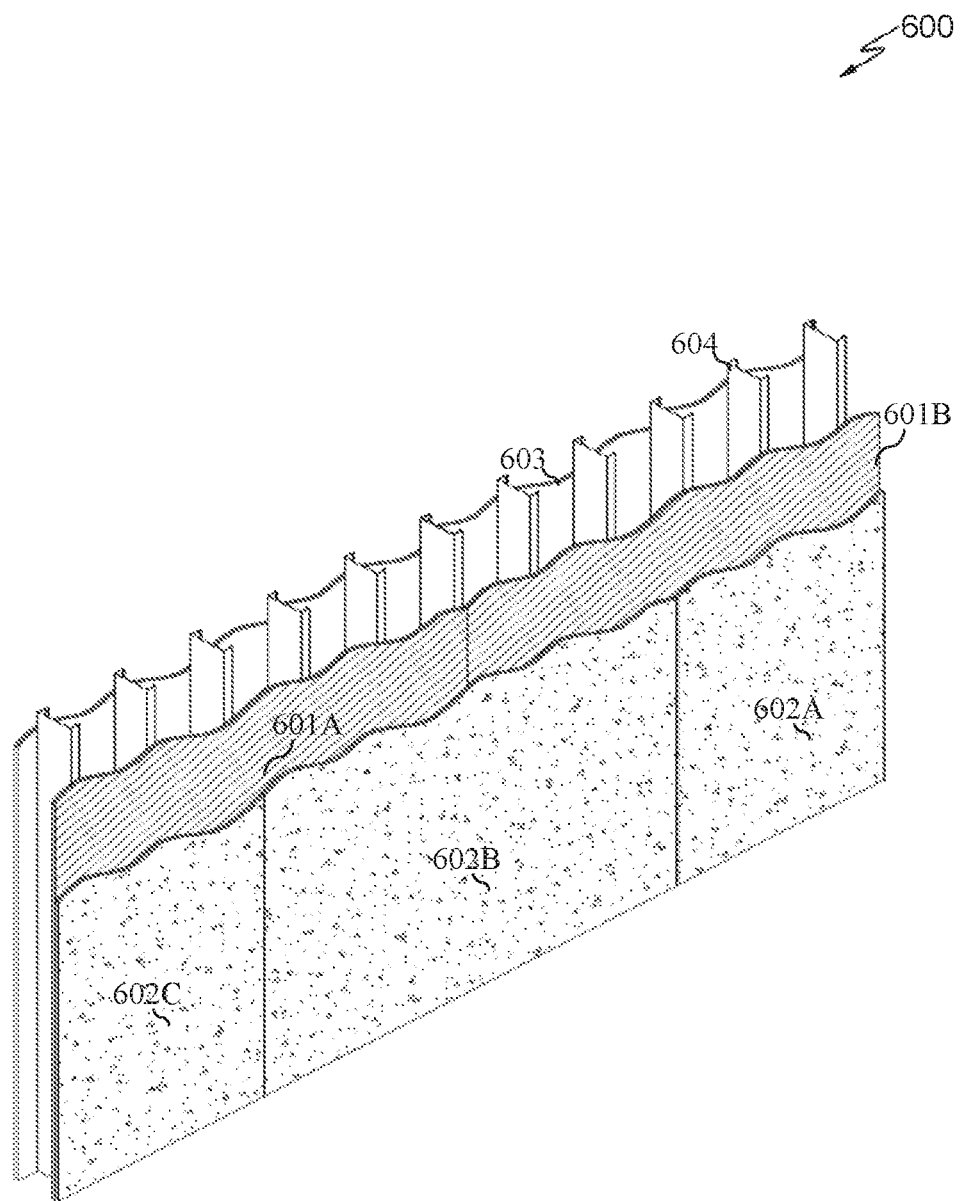
FIG. 6 depicts a section view of a floor with multiple layers of sheathing materials installed, in accordance with one embodiment of the present invention.

As shown in FIG. 6, a floor section is shown with sheathing layers 601, 602, and 603 installed on a frame 604. Each sheathing layer is shown in different section sizes. For example, sheathing layer 602 is comprised of parts 602A, 602B, and 602C and sheathing layer 601 is comprised of sections 601A and 601B. As shown with layer 602, 602A, 602B and 602C are of a different width. The installation optimization program 108 is able to detect the end of the panel and modify the size of the section to fit where it does not conflict with the adjoining floor, ceiling, or floor sheathing layers.

Figure 7:
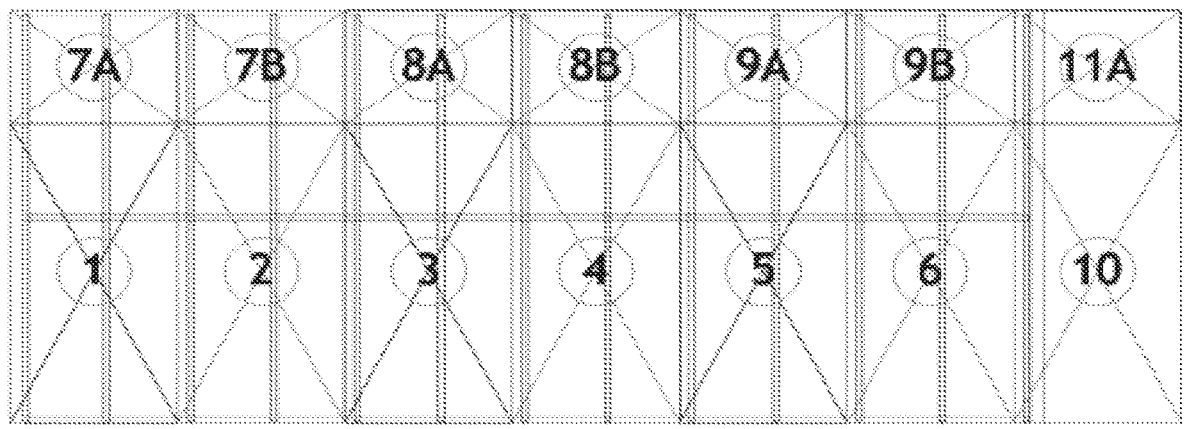
FIG. 7 depicts a floor with a series of sheathing material panels applied, in accordance with one embodiment of the present invention.

As shown in FIG. 7, floor 700 is shown divided out into a set of sections 1, 2, 3, 4, 5, 6, 7A, 7B, 8A, 8B, 9A, 9B, 10, and 11A. The illustration shows sheathing material panels 1-11A superimposed over the frame members and how the panels line up with the frame members and one another to confirm that the panels can be secured to the frame members for the exterior sheathing. These sections are calculated based on the sheathing material type. In some cases, the various sheathing materials are manufactured in standard sizes, pieces, thickness and the like. In FIG. 7 sections 1, 2, 3, 4, 5, 6, and 10 are standard sheathing material pieces, and sections 7A, 7B, 8A, 8B, 9A, 9B, and 1/A are modified pieces of sheathing material. The installation optimization program 108 is able to identify these standard part sizes and apply them to the sheathing layers.

In some embodiments, the installation optimization program 108 is able to determine how to modify the sheathing material panels to reduce waste product. For example, in FIG. 7A, the installation optimization program 108 may determine that a panel can be cut into thirds and equates to panels 7A, 7B, 8A. This reduces the number of panels which are needed to be purchased at a manufacture standard sizes, and the personnel preparing the bundles can properly cut the panels to size if they are not manufactured at the predetermined sizes. In instances where a standard panel of sheathing material is needed to be modified to fit, the excess material of the panel may be used on another floor surface. The installation optimization program 108 is able to take into account all floor surfaces which use the same sheathing material, determine where the panels need to be modified, and determine if the remainder of the panel can be used elsewhere.

Additionally, the installation optimization program 108 is able to assist in the calculating of fastening materials where applicable. In some instances, a sheathing layer may be secured or fastened to the frame through the use of fasteners or the like. The installation optimization program 108 is able to calculate the number of fasteners needed to secure the sheathing material to the frame. This may be based on the analysis of the frame where preset fastening locations are identified, a measured distance between the fastening locations, or an estimate of the fastening location based on industry standards or preset requirements. The calculation is only an estimation as the program cannot detect lost or damaged fasteners. The number of fasteners can be modified and adjusted based on a user's adjustment of the spacing of the frame members or the spacing of the fasteners.

In some embodiments, the installation optimization program 108 optimizes the sheathing material shipping arrangement. In the optimization of the shipping arrangement of the sheathing material, the installation optimization program 108 determined how many panels are in the bundle, the size of each panel, and determines the ideal method to bundle the panels to consume as little space as possible in the container. In some embodiments, the installation optimization program 108 takes into account other bundles which are to be placed in the container so that the bundles "fit" together within the container and the lease amount of space is wasted between the bundles.

Figure 8:
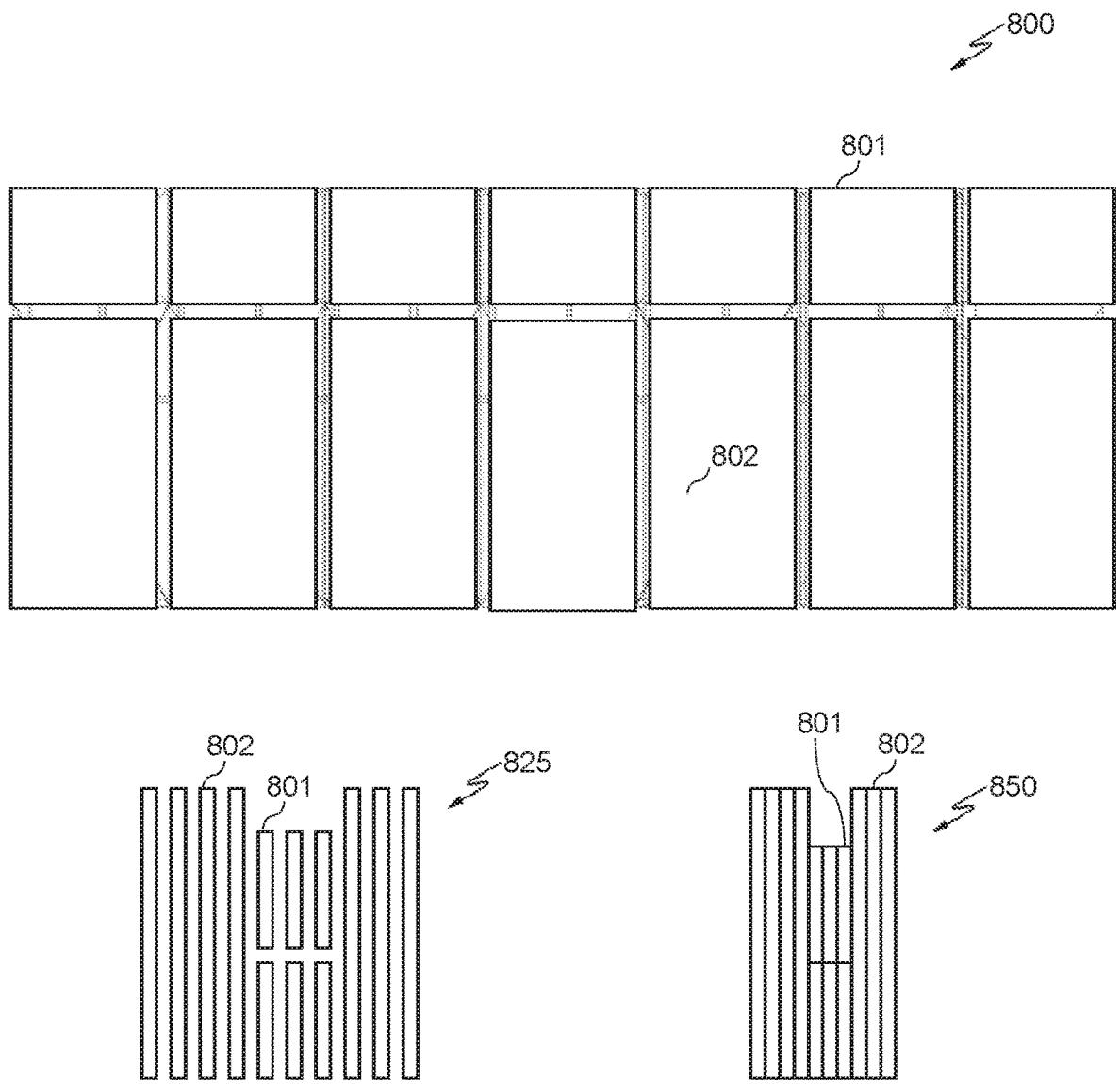
FIG. 8 depicts the floor with the series of sheathing material panels applied and bundled, in accordance with one embodiment of the present invention.

As shown in FIG. 8 a roof 800 is segmented out to show ach piece of sheathing material. In some embodiments, the installation optimization program 108 applies a plurality of sheathing material panels to the surface and based on the analysis of the edges of the surface is able to remove the excess portions of panels which are beyond the limits of the calculated area. In some embodiments, the installation optimization program 108 takes these sections of sheathing material which are deleted or removed from the area outside the calculated area and uses them in spaces where sheathing material has not been applied yet. In some embodiments, the installation optimization program 108 begins the process by placing a panel of sheathing material in a space where the entire sheathing material panel fits within the area, and then applies various full and partial sheathing material panels to cover the area.

The installation optimization program 108 is also able to take into account the corners and the overlap of the sheathing material to reduce any overhang or overlapping of the sheathing material. This illustration depicts the arrangement of the sheathing board on the floor frame. The installation optimization program 108 identifies the arrangement of the full sheet and cut sheet along length, cut sheet along width and cut sheet along length and width. The arrangement of the pieces of sheathing material may also provide a number associated with each piece of sheathing material, and the numbers coincide with the desired installation order of the pieces. By providing the order of installation, there further reduces the possibility of any waste material or incorrect installation of material.

In Step 410, the installation optimization program 108 determines the sequence of placement of each piece of sheathing material in the bundle. The installation optimization program 108 takes into account the number of piece of material, the size of the pieces of material, the type of material and determines the ideal bundling to minimize the size of the bundle, protect the material pieces, and take into account the various other bundles which would be placed in the container so that container is not overloaded, or that any space is wasted due to poor bundling techniques. The arrangement of the pieces is prepared to show which panels will fit inside which other panels and also the short/small panels are stacked on each other so that the volume of each bundle is least volume.

Depicted in FIG. 7A is an illustration 700 of a floor with the sheathing material panels identified to cover the frame. There is a first set of panels: 1, 2, 3, 4, 5, 6, 10 of a first sizes and a second set of panels: 7A, 7B, 8A, 8B, 9A, 9B, and 11A of a second size. These panels are identified as 702 and 701 respectively. These panels are identified by installation optimization program 108. The installation optimization program 108 takes the panels and creates an exploded view of the panels to provide for an illustration to easily identify the different panels. In the present embodiment the panels are of only two sizes, but in some instances, there may be multiple panel sizes that may be difficult to identify in the illustration show of the bundle completed. The installation optimization program 108 determines the proper ordering of the panels to both account for the overall volume of the bundle, the anticipated installation of the panels, the other bundles which are placed within the same container, and the necessary protection of the panels or sheathing material. In the depicted embodiment, the panels are made of sheetrock, a relatively strong material when stacked, but can easily break when packaged incorrectly. By placing the smaller panels 701 within the larger panels 702, the bundle is created to protect these smaller panels and provide an easy removal of the panels when installing, as the installation process is likely to include installing the larger panels 902 first, and then placing the smaller panels 901 after.

The installation optimization program 108 identify the most optimized sequence of the placement of the bundles inside the shipping container such that maximum volume is occupied by the bundles and with minimum open space in the shipping container. This may require, once the installation optimization program 108 has determined the number of bundles and the composition of the bundles to adjust the bundle design to permit the bundles to "fit" within the container with less wasted space. The installation optimization program 108 may also take into account the assembly process of the building/structure, the layers of materials based on the frame type or locate within the structure, or the like. In some embodiments, the installation optimization program 108 may modify bundles to provide a more efficient placement within the container.

Figure 9:
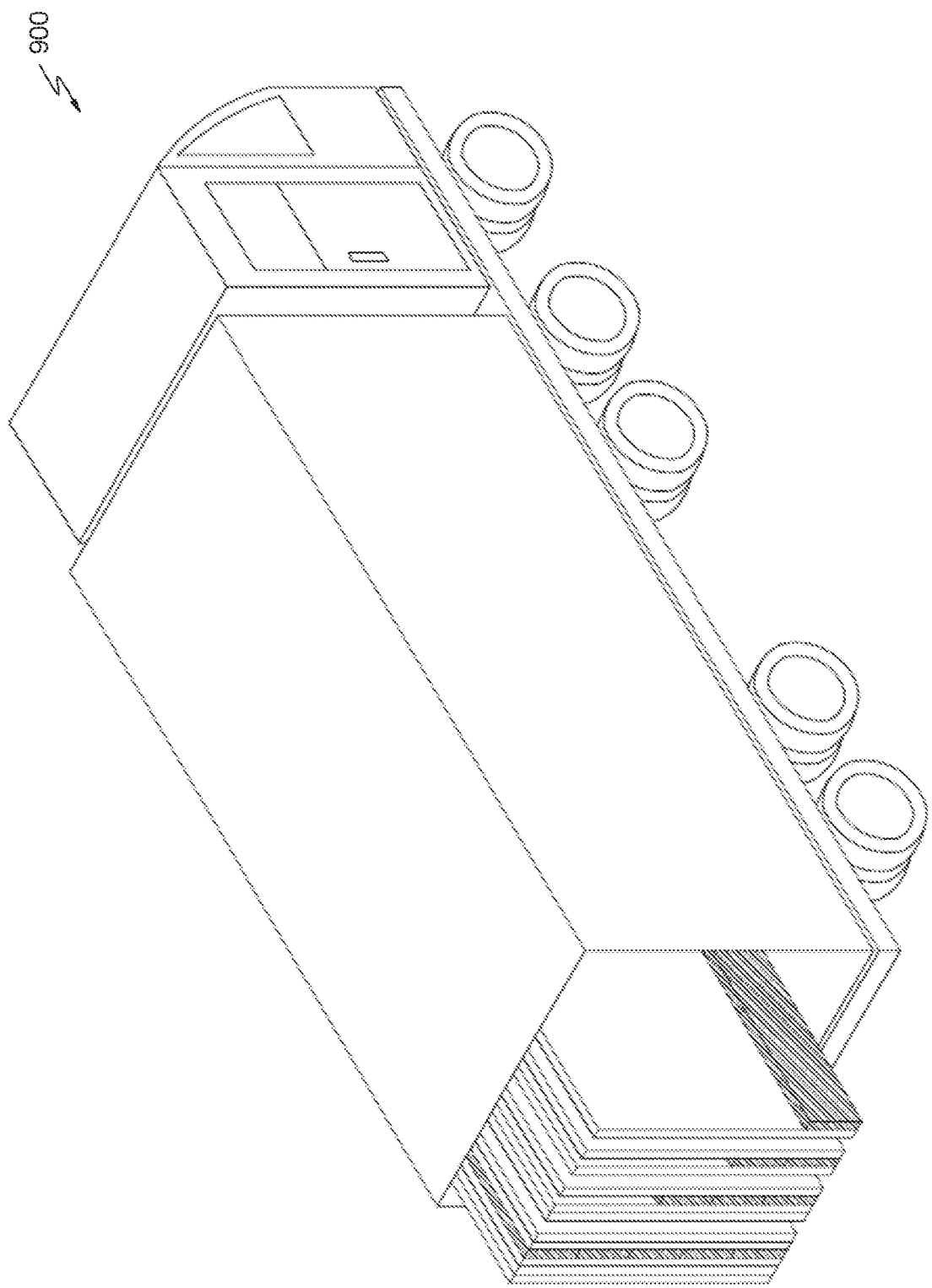
FIG. 9 depict an illustration of the sheathing material bundles in a shipping vessel, in accordance with one embodiment of the present invention.

In Step 412, the installation optimization program 108 creates the drawings or illustrations to show the bundle formation, the placement of the bundle in the shipping vessel, and the assembly of the bundle. In additional embodiments, the installation optimization program 108 may create drawings showing the view of the container from the front, side, and isometric views to show the location of each bundle inside the container. The drawing also shows the sequence of loading and unloading of the bundles in the containers. FIG. 9 shows image 9 of bundles placed within a shipping container for transportation. The order of the bundles is based on the preferred removal of the bundles for the construction of the building or structure based on the understanding of the building process and installation of the sheathing material. Through the generation of these images, the workers are able to easily identify the proper bundle for the frame and install the sheathing material with minimal confusion or issues.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firefloors, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

The foregoing descriptions of various embodiments have been presented only for purposes of illustration and description. They are not intended to be exhaustive or to limit the present invention to the forms disclosed. Accordingly, many modifications and variations of the present invention are possible in light of the above teachings will be apparent to practitioners skilled in the art. Additionally, the above disclosure is not intended to limit the present invention. In the specification and claims the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g. attached, adhered, joined) are to be construed broadly and may include intermediate members between a connection of elements and relative movement between elements. As such, joinder references do not necessarily infer that two elements are directly connected and in fixed relation to each other. Moreover, network connection references are to be construed broadly and may include intermediate members or devices between network connections of elements. As such, network connection references do not necessarily infer that two elements are in direct communication with each other. In some instances, in methodologies directly or indirectly set forth herein, various steps and operations are described in one possible order of operation, but those skilled in the art will recognize that steps and operations may be rearranged, replaced or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to the embodiments outlined above, various alternatives, modifications, variations, improvements and/or substantial equivalents, whether known or that are or may be presently foreseen, may become apparent to those having at least ordinary skill in the art. Listing the steps of a method in a certain order does not constitute any limitation on the order of the steps of the method. Accordingly, the embodiments of the invention set forth above are intended to be illustrative, not limiting. Persons skilled in the art will recognize that changes may be made in form and detail without departing from the spirit and scope of the invention. Therefore, the invention is intended to embrace all known or earlier developed alternatives, modifications, variations, improvements and/or substantial equivalent.

The invention claimed is:

1. A computer method for calculating and arranging sheathing material for a floor space of a building, comprising:
    analyzing, by at least one processor, a building model, wherein floor frame members are identified and isolated;
    processing, by the at least one processor, a surface of the floor frame members;
    calculating, by at least one processor, an area of the surface;
    selecting, by the at least one processor, a sheathing material for the surface, wherein the sheathing material has a predetermined panel size;
    generating, by the at least one processors, a graphical illustration on the model of a sheathing material panel layout;
    manipulating, by the at least one processor, the sheathing material panels to substantially cover the area of the surface, wherein excess sheathing material panels are removed from the model;
    arranging, by the at least one processor, the sheathing material based on an analyzed installation process to require the fewest number of panels, wherein the arrangement of the sheathing material, further comprises, altering, by the at least one processor, a predetermined number of the sheathing material panels to cover excess exposed surface;
    formulating, by the at least one processor, at least one bundle, wherein the at least one bundle is comprised of altered and unaltered pieces of the sheathing material required to substantially cover the area of the surface of the floor, wherein the formulation of the at least one bundle, further comprises:
        analyzing a set of additional bundles which are placed within a container; and
        altering the at least one bundle to reduce excess space within the container and to interface the at least one bundle and the set of additional bundles within the container; and
    generating, by the at least one processor, a set of three-dimensional images depicting each of the at least one bundle and the set of additional bundles within the container.

2. The computer method of claim 1, further comprising, identifying, by the at least one processor, sections of the floor surface which are to be excluded from the area calculation.

3. The computer method of claim 1, further comprising, calculating, by the at least one processor, a set of fasteners to secure the sheathing material panels to the floor frame members.

4. A computer program product for calculating and arranging sheathing material for a floor space of a building, comprising:
    one or more computer non-transitory readable storage media and program instructions stored on the one or more computer non-transitory readable storage media, the program instructions executable by a computing device cause the computing device to:

analyze a building model, wherein floor frame members are identified and isolated;

to process a surface of the floor frame members;

calculate an area of the surface;

select a sheathing material for the surface, wherein the sheathing material has a predetermined panel size;

generate a graphical illustration on the model of a sheathing material panel layout;

manipulate sheathing material panels of the selected sheathing material to substantially cover the area of the surface, wherein excess sheathing material panels are removed from the model;

arrange the sheathing material based on an analyzed installation process to require the fewest number of panels, wherein the arrangement of the sheathing material, further comprises, altering a predetermined number of the sheathing material panels to cover excess exposed surface;

formulate at least one bundle, wherein the at least one bundle is comprised of altered and unaltered pieces of the sheathing material required to substantially cover the area of the surface of the floor, wherein the formulation of the at least one bundle, further comprises:

analyzing a set of additional bundles which are placed within a container; and altering the at least one bundle to reduce excess space within the container and to interface the at least one bundle and the set of additional bundles within the container; and generate a set of three-dimensional images depicting each of the at least one bundle and the set of additional bundles within the container.

5. The computer program product of claim 4, wherein the program instructions executable by the computing device further cause the computing device to: identify sections of the floor surface which are to be excluded from the area calculation.

6. The computer program product of claim 4, wherein the program instructions executable by the computing device further cause the computing device to: calculate a set of fasteners to secure the sheathing material panels to the floor frame members.

7. A system for calculating and arranging sheathing material for a floor space of a building, comprising:

one or more computer processors, one or more computer non-transitory readable storage media, and program instructions stored on the one or more computer non-transitory readable storage media for execution by, at least one of the one or more processors, wherein the at least one of the one or more computer processors are configured to:

analyze a building model, wherein floor frame members are identified and isolated;

process a surface of the floor frame members; program instructions to calculate an area of the surface;

select a sheathing material for the surface, wherein the sheathing material has a predetermined panel size;

generate a graphical illustration on the model of a sheathing material panel layout;

manipulate sheathing material panels of the selected sheathing material to substantially cover the area of the surface, wherein excess sheathing material panels are removed from the model;

arrange the sheathing material based on an analyzed installation process to require the fewest number of panels, wherein the arrangement of the sheathing material, further comprises, altering a predetermined number of the sheathing material panels to cover excess exposed surface;

formulate at least one bundle, wherein the at least one bundle is comprised of altered and unaltered pieces of the sheathing material required to substantially cover the area of the surface of the floor, wherein the formulation of the at least one bundle, further comprises:

analyzing a set of additional bundles which are placed within a container; and altering the at least one bundle to reduce excess space within the container and to interface the at least one bundle and the set of additional bundles within the container; and generate a set of three-dimensional images depicting each of the at least one bundle and the set of additional bundles within the container.

8. The system of claim 7, wherein the at least one of the one or more computer processors is further configured to: identify sections of the floor surface which are to be excluded from the area calculation.

9. The system of claim 7, wherein the at least one of the one or more computer processors is further configured to: calculate a set of fasteners to secure the sheathing material panels to the floor frame members.

* * * * *